United States Patent [19]
Houle et al.

[11] Patent Number: 5,838,266
[45] Date of Patent: *Nov. 17, 1998

[54] DATA PROCESSING APPARATUS AND METHOD USING DATA COMPRESSION

[75] Inventors: Paul S. Houle, Costa Mesa; Alfred C. Yu, Irvine; David Dvorman, Orange, all of Calif.

[73] Assignee: Universal Video Communications Corp., Irvine, Calif.

[ * ] Notice: The terminal 27 months of this patent has been disclaimed.

[21] Appl. No.: 611,142

[22] Filed: Dec. 12, 1990

[51] Int. Cl.⁶ .............................. H03M 7/42; H03M 7/36
[52] U.S. Cl. ................................ 341/51; 341/67; 341/76; 341/106; 341/107
[58] Field of Search ......................... 341/51, 106, 107, 341/67, 76

[56] References Cited

U.S. PATENT DOCUMENTS

| | | | |
|---|---|---|---|
| 4,591,829 | 5/1986 | Takeda | 341/116 |
| 4,626,829 | 12/1986 | Hanck . | |
| 4,797,653 | 1/1989 | Takayama | 341/51 |
| 4,816,901 | 3/1989 | Music et al. | 358/13 |
| 4,843,466 | 6/1989 | Music et al. | 358/133 |
| 4,847,677 | 7/1989 | Music et al. | 358/13 |
| 4,849,807 | 7/1989 | Music et al. | 358/13 |
| 4,857,991 | 8/1989 | Music et al. | 358/13 |
| 4,857,993 | 8/1989 | Music et al. | 358/13 |
| 4,862,167 | 8/1989 | Copeland, III | 341/107 |
| 4,914,508 | 4/1990 | Music et al. | 358/13 |
| 5,007,102 | 4/1991 | Haskell | 341/51 X |

*Primary Examiner*—Sharon D. Logan
*Attorney, Agent, or Firm*—Fulwider Patton Lee & Utecht

[57] ABSTRACT

A method and apparatus for processing data using data compression. During compression, a relationship between a next data word and a previous data word is determined and that relationship is encoded into variable bit-length code words, the bit-length being inversely proportional to the probability of occurrence of the relationship between the data words. The encoded relationships are transmitted rather than the data words themselves. In one embodiment, a look-up table of code words is stored which is indexed according to the possible relationships. A relationship is determined between the previous and next data words and the relationship is matched to the index to find the corresponding code word in the look-up table. The corresponding code word is retrieved from the look-up table, is substituted for the relationship, and is transmitted.

15 Claims, 11 Drawing Sheets

| Previously Occurring Length | Output Bits for Input Length | | | |
|---|---|---|---|---|
| 0 | 0: 0 | 8: 1111001 | | |
| | 1: 10 | 9: 1111010 | | |
| | 2: 1101 | a: 1111011 | | |
| | 3: 11100 | b: 1111100 | | |
| | 4: 1110110 | c: 1111101 | | |
| | 5: 1110111 | d: 1111110 | | |
| | 6: 1111000 | e: 1100 | | |
| | 7: 111010 | f: 1111111 | | |
| 1 | 0: 00 | 8: 111100 | | |
| | 1: 01 | 9: 1111010 | | |
| | 2: 100 | a: 1111011 | | |
| | 3: 1100 | b: 1111100 | | |
| | 4: 1101 | c: 1111101 | | |
| | 5: 11100 | d: 1111110 | | |
| | 6: 111010 | e: 101 | | |
| | 7: 111011 | f: 1111111 | | |
| 2 | (same as table 1) | | | |
| 3 | (same as table 1) | | | |
| 4 | (same as table 1) | | | |
| 5 | (same as table 1) | | | |
| 6 | (same as table 1) | | | |
| 7 | (same as table 1) | | | |
| 8 | (same as table 1) | | | |
| 9 | (same as table 1) | | | |
| a | (same as table 1) | | | |
| b | (same as table 1) | | | |
| c | (same as table 1) | | | |
| d | (same as table 1) | | | |
| e | 0: 1001 | 8: 11100 | | |
| | 1: 1000 | 9: 11101 | | |
| | 2: 10100 | a: 11011 | | |
| | 3: 10101 | b: 11001 | | |
| | 4: 10110 | c: 11110 | | |
| | 5: 10111 | d: 111110 | | |
| | 6: 11000 | e: 0 | | |
| | 7: 11010 | f: 111111 | | |
| | (same as table 1) | | | |

| adr | code | wid | adr | code | wid | adr | code | wid | adr | code | wid |
|-----|------|-----|-----|------|-----|-----|------|-----|-----|------|-----|
| 0 | | 07 | 1 | | 07 | 2 | | 07 | 3 | | 07 |
| 4 | | 07 | 5 | | 07 | 6 | | 07 | 7 | | 07 |
| 8 | edc | 5 | 9 | f24 | 5 | a | | 07 | b | | 07 |
| c | ef8 | 5 | d | e8f | 5 | e | f3c | 5 | f | | 07 |
| 10 | f06 | 5 | 11 | eb7 | 5 | 12 | e8a | 5 | 13 | f28 | 5 |
| 14 | f57 | 5 | 15 | ea5 | 5 | 16 | ecb | 5 | 17 | efb | 5 |
| 18 | | 07 | 19 | f14 | 5 | 1a | ea7 | 5 | 1b | ec0 | 5 |
| 1c | f69 | 5 | 1d | | 07 | 1e | f2a | 5 | 1f | e97 | 5 |
| 20 | ecc | 5 | 21 | | 07 | 22 | | 07 | 23 | | 07 |
| 24 | | 07 | 25 | | 07 | 26 | | 07 | 27 | | 07 |
| 28 | | 07 | 29 | | 07 | 2a | f58 | 5 | 2b | efc | 5 |
| 2c | | 07 | 2d | | 07 | 2e | f3d | 5 | 2f | e89 | 5 |
| 30 | e10 | 4 | 31 | f38 | 5 | 32 | | 07 | 33 | ef6 | 5 |
| 34 | e81 | 5 | 35 | e82 | 5 | 36 | f60 | 5 | 37 | | 07 |
| 38 | ee2 | 5 | 39 | e9b | 5 | 3a | edf | 5 | 3b | | 07 |
| 3c | f15 | 5 | 3d | ea4 | 5 | 3e | ead | 5 | 3f | | 07 |
| 40 | | 07 | 41 | f63 | 5 | 42 | eca | 5 | 43 | f26 | 5 |
| 44 | | 07 | 45 | | 07 | 46 | | 07 | 47 | f4a | 5 |
| 48 | f30 | 5 | 49 | f6e | 5 | 4a | | 07 | 4b | | 07 |
| 4c | f3f | 5 | 4d | eb9 | 5 | 4e | ebe | 5 | 4f | f73 | 5 |

FIG. 4B

| | | | | | | | | | | |
|---|---|---|---|---|---|---|---|---|---|---|
| 50 | 07 | | 51 | eb1 | 5 | 52 | d40 | 4 | 53 | d90 4 |
| 54 | f12 | 5 | 55 | 07 | | 56 | e70 | 4 | 57 | cb8 4 |
| 58 | cf8 | 4 | 59 | f20 | 5 | 5a | 07 | | 5b | e95 5 |
| 5c | d88 | 5 | 5d | e83 | 5 | 5e | 07 | | 5f | 07 |
| 60 | ecd | 5 | 61 | edd | 5 | 62 | f55 | 5 | 63 | 07 |
| 64 | 07 | | 65 | efa | 5 | 66 | f59 | 5 | 67 | 07 |
| 68 | 07 | | 69 | 07 | | 6a | f3a | 5 | 6b | eec 5 |
| 6c | f37 | 5 | 6d | 07 | | 6e | 07 | | 6f | ecf 5 |
| 70 | dc8 | 4 | 71 | e20 | 4 | 72 | f34 | 5 | 73 | f4b 5 |
| 74 | e68 | 4 | 75 | c30 | 4 | 76 | c98 | 4 | 77 | ed9 5 |
| 78 | f62 | 5 | 79 | d18 | 4 | 7a | bc0 | 4 | 7b | c48 4 |
| 7c | ef0 | 5 | 7d | f4c | 5 | 7e | d80 | 4 | 7f | c58 4 |
| 80 | d78 | 4 | 81 | f45 | 5 | 82 | 07 | | 83 | ece 5 |
| 84 | e9e | 5 | 85 | f08 | 5 | 86 | 07 | | 87 | 07 |
| 88 | 07 | | 89 | 07 | | 8a | 07 | | 8b | 07 |
| 8c | e98 | 5 | 8d | efe | 5 | 8e | e80 | 5 | 8f | ea6 5 |
| 90 | ef1 | 5 | 91 | 07 | | 92 | ee4 | 5 | 93 | d30 4 |
| 94 | d60 | 4 | 95 | f27 | 5 | 96 | ee9 | 5 | 97 | dd8 4 |
| 98 | b60 | 3 | 99 | bb8 | 4 | 9a | ebc | 5 | 9b | f56 5 |
| 9c | c68 | 4 | 9d | a00 | 3 | 9e | b88 | 4 | 9f | eb3 5 |
| a0 | f46 | 5 | a1 | cd8 | 4 | a2 | ba8 | 4 | a3 | ce0 4 |

FIG. 4C

| | | | | | | |
|---|---|---|---|---|---|---|
| a4 | f1c 5 | a5 | f6d 5 | a6 | eb8 5 | a7 | e08 4 |
| a8 | ebb 5 | a9 | f16 5 | aa | 0 7 | ab | f67 5 |
| ac | ee3 5 | ad | f35 5 | ae | 0 7 | af | 0 7 |
| b0 | 0 7 | b1 | f3b 5 | b2 | e40 4 | b3 | ed1 5 |
| b4 | f42 5 | b5 | df0 4 | b6 | bb0 4 | b7 | c38 4 |
| b8 | e90 5 | b9 | c50 4 | ba | ce8 4 | bb | 980 3 |
| bc | 9a0 3 | bd | cc8 4 | be | f0d 5 | bf | b98 4 |
| c0 | 740 2 | c1 | 9c0 3 | c2 | cf0 4 | c3 | f04 5 |
| c4 | bf0 4 | c5 | a60 3 | c6 | c80 4 | c7 | eb2 5 |
| c8 | f75 5 | c9 | e86 5 | ca | d68 4 | cb | ec5 5 |
| cc | f6a 5 | cd | 0 7 | ce | f4d 5 | cf | eb5 5 |
| d0 | f78 5 | d1 | ef7 5 | d2 | 0 7 | d3 | ec2 5 |
| d4 | f1b 5 | d5 | ea0 5 | d6 | f66 5 | d7 | f50 5 |
| d8 | ec7 5 | d9 | c88 4 | da | c18 4 | db | ee1 5 |
| dc | eea 5 | dd | a40 3 | de | 500 1 | df | 680 2 |
| e0 | db0 4 | e1 | f03 5 | e2 | 940 2 | e3 | 400 1 |
| e4 | 780 2 | e5 | e58 4 | e6 | eeb 5 | e7 | aa0 3 |
| e8 | 880 2 | e9 | b80 4 | ea | eee 5 | eb | f5a 5 |
| ec | da8 4 | ed | d28 4 | ee | e9c 5 | ef | f71 5 |
| f0 | f5c 5 | f1 | f3e 5 | f2 | eaf 5 | f3 | f52 5 |
| f4 | 0 7 | f5 | 0 7 | f6 | 0 7 | f7 | ede 5 |

FIG. 4D

| | | | | | | |
|---|---|---|---|---|---|---|
| f8 | ef9 5 | f9 | 0 7 | fa | f1f 5 | fb | ec8 5 |
| fc | cb0 4 | fd | d00 4 | fe | f22 5 | ff | f0c 5 |
| 100 | c20 4 | 101 | 5c0 2 | 102 | 900 2 | 103 | e91 5 |
| 104 | db8 4 | 105 | 600 2 | 106 | fff 0 | 107 | 6c0 2 |
| 108 | e84 5 | 109 | d50 4 | 10a | 840 2 | 10b | 580 2 |
| 10c | c28 4 | 10d | f32 5 | 10e | d70 4 | 10f | c40 4 |
| 110 | c78 4 | 111 | eaa 5 | 112 | f33 5 | 113 | f23 5 |
| 114 | ed2 5 | 115 | eda 5 | 116 | 0 7 | 117 | 0 7 |
| 118 | 0 7 | 119 | f7d 5 | 11a | f18 5 | 11b | f65 5 |
| 11c | 0 7 | 11d | 0 7 | 11e | e87 5 | 11f | ba0 4 |
| 120 | c60 4 | 121 | f43 5 | 122 | f47 5 | 123 | bf8 4 |
| 124 | 8c0 2 | 125 | ac0 3 | 126 | eb4 5 | 127 | ec3 5 |
| 128 | 800 2 | 129 | 480 1 | 12a | 9e0 3 | 12b | ed3 5 |
| 12c | e48 4 | 12d | 700 2 | 12e | 640 2 | 12f | bd0 4 |
| 130 | efd 5 | 131 | f2c 5 | 132 | d20 4 | 133 | d10 4 |
| 134 | edb 5 | 135 | f6f 5 | 136 | 0 7 | 137 | f41 5 |
| 138 | f4e 5 | 139 | 0 7 | 13a | 0 7 | 13b | f2f 5 |
| 13c | 0 7 | 13d | 0 7 | 13e | f77 5 | 13f | 0 7 |
| 140 | f79 5 | 141 | ed7 5 | 142 | e00 4 | 143 | e60 4 |
| 144 | f61 5 | 145 | eff 5 | 146 | ca0 4 | 147 | b20 3 |
| 148 | be8 4 | 149 | ee8 5 | 14a | e78 4 | 14b | a80 3 |

FIG. 4E

| | | | | | | | |
|---|---|---|---|---|---|---|---|
| 14c | 7c0 2 | 14d | b90 4 | 14e | f0b 5 | 14f | de0 4 |
| 150 | b00 3 | 151 | a20 3 | 152 | d38 4 | 153 | f7a 5 |
| 154 | e88 5 | 155 | b40 3 | 156 | be0 4 | 157 | e30 4 |
| 158 | f6b 5 | 159 | f4f 5 | 15a | e85 5 | 15b | f64 5 |
| 15c | 07 | 15d | 07 | 15e | 07 | 15f | 07 |
| 160 | 07 | 161 | 07 | 162 | 07 | 163 | f68 5 |
| 164 | f01 5 | 165 | e92 5 | 166 | ea8 5 | 167 | 07 |
| 168 | f1e 5 | 169 | d58 4 | 16a | c00 4 | 16b | cd0 4 |
| 16c | f39 5 | 16d | e94 5 | 16e | bd8 4 | 16f | ae0 3 |
| 170 | c70 4 | 171 | f5f 5 | 172 | e9d 5 | 173 | c10 4 |
| 174 | bc8 4 | 175 | e38 4 | 176 | eb0 5 | 177 | f0a 5 |
| 178 | dc0 4 | 179 | de8 4 | 17a | f0f 5 | 17b | f7b 5 |
| 17c | f72 5 | 17d | ea3 5 | 17e | e8d 5 | 17f | f00 5 |
| 180 | f5b 5 | 181 | 07 | 182 | 07 | 183 | 07 |
| 184 | 07 | 185 | 07 | 186 | 07 | 187 | f1a 5 |
| 188 | ed6 5 | 189 | ef2 5 | 18a | 07 | 18b | f05 5 |
| 18c | e28 4 | 18d | d08 4 | 18e | e18 4 | 18f | f2e 5 |
| 190 | ebd 5 | 191 | c90 4 | 192 | c08 4 | 193 | dd0 4 |
| 194 | f25 5 | 195 | e9f 5 | 196 | cc0 4 | 197 | ca8 4 |
| 198 | ec1 5 | 199 | eed 5 | 19a | f07 5 | 19b | e93 5 |
| 19c | ea9 5 | 19d | f70 5 | 19e | 07 | 19f | f5e 5 |
| 1a0 | f2d 5 | 1a1 | f21 5 | 1a2 | 07 | 1a3 | 07 |

FIG. 4F

| | | | | | | | |
|---|---|---|---|---|---|---|---|
| 1a4 | 07 | 1a5 | 07 | 1a6 | 07 | 1a7 | f7e 5 |
| 1a8 | 07 | 1a9 | 07 | 1aa | f53 5 | 1ab | ef4 5 |
| 1ac | f09 5 | 1ad | f48 5 | 1ae | f44 5 | 1af | e99 5 |
| 1b0 | e50 4 | 1b1 | ec4 5 | 1b2 | f6c 5 | 1b3 | ee0 5 |
| 1b4 | d98 4 | 1b5 | d48 4 | 1b6 | eab 5 | 1b7 | f74 5 |
| 1b8 | ed4 5 | 1b9 | da0 4 | 1ba | df8 4 | 1bb | f10 5 |
| 1bc | 07 | 1bd | f36 5 | 1be | ec6 5 | 1bf | ee5 5 |
| 1c0 | ed0 5 | 1c1 | 07 | 1c2 | 07 | 1c3 | 07 |
| 1c4 | f7f 5 | 1c5 | 07 | 1c6 | 07 | 1c7 | 07 |
| 1c8 | 07 | 1c9 | 07 | 1ca | ee6 5 | 1cb | f1d 5 |
| 1cc | 07 | 1cd | f76 5 | 1ce | f13 5 | 1cf | ed5 5 |
| 1d0 | eb6 5 | 1d1 | 07 | 1d2 | ef5 5 | 1d3 | eac 5 |
| 1d4 | ec9 5 | 1d5 | f11 5 | 1d6 | f54 5 | 1d7 | e96 5 |
| 1d8 | e8e 5 | 1d9 | f0e 5 | 1da | 07 | 1db | f29 5 |
| 1dc | e8c 5 | 1dd | eae 5 | 1de | f5d 5 | 1df | 07 |
| 1e0 | f49 5 | 1e1 | eef 5 | 1e2 | f19 5 | 1e3 | 07 |
| 1e4 | 07 | 1e5 | 07 | 1e6 | 07 | 1e7 | 07 |
| 1e8 | 07 | 1e9 | 07 | 1ea | 07 | 1eb | 07 |
| 1ec | f7c 5 | 1ed | 07 | 1ee | f02 5 | 1ef | 07 |
| 1f0 | f40 5 | 1f1 | ed8 5 | 1f2 | e9a 5 | 1f3 | ee7 5 |
| 1f4 | 07 | 1f5 | ef3 5 | 1f6 | ebf 5 | 1f7 | ea2 5 |

FIG. 4G

| 1f8 | f31 5 | 1f9 | f51 5 | 1fa | e8b 5 | 1fb | eba 5 |
| 1fc | f17 5 | 1fd | 07 | 1fe | f2b 5 | 1ff | ea1 5 |
| 200 | 07 | 201 | 07 | 202 | 07 | 203 | 07 |
| 204 | 07 | 205 | 07 | 206 | 07 | 207 | 07 |
| 208 | 07 | 209 | 07 | 20a | 07 | 20b | 07 |
| 20c | | | | | | | |

DATA PROCESSING APPARATUS AND METHOD USING DATA COMPRESSION

BACKGROUND

The invention relates generally to information signal processing and more particularly, to data compression.

In cases where relatively large amounts of data must be transmitted over a transmission medium which cannot accommodate the data at the rate desired, a data compression technique may be considered. Such techniques compress the data to be transmitted into a smaller amount of data typically by identifying and replacing repetitive data with less data. This compressed data, if compressed enough, may then be transmitted at the rate desired. At the receiving end, the data is decompressed for use as required. Data compression permits more efficient use of the transmission process in that a higher density of data is transmitted in a given period of time.

For example, in the case of color video, a transmission rate of approximately 200 Mbits/sec is, in some cases, required. The use of lower transmission rates may adversely affect the ability to reconstruct a sufficient number of frames per second so that a real time picture is acceptable to the viewer. Various compression techniques have been used to transmit the color video information at reduced transmission rates. Some techniques, however, do not provide enough compression and the reduced transmission rate results in reconstructed frames presenting a poor quality picture. Some other techniques which use a higher transmission speed result in the loss of data thus the reconstructed picture is not an accurate representation of the original picture and may, in some cases, be noticeably distorted.

In the case of data storage, data compression may likewise be used to compress a unit of data into a smaller amount so that less storage space is used. This results in a greater density of data stored in the storage medium and more efficient use thereof. As with data transmission, loss of data is in many cases undesirable, thus a lossless data storage compression technique would be preferred.

One compression technique particularly applicable to color video data comprises the use of a code word having a color segment representing the three digital color components of a pixel and a length segment for the number of subsequent pixels having the same color components. Code words which follow this code word may indicate only changes in the color and in the length of pixels. One embodiment of such a code word has sixteen bits and includes color pixel data of three, four-bit segments totaling twelve bits. Each four-bit segment represents one of the three colors for the pixel. Also included in the code word is a four-bit segment containing the number of subsequent pixels to which this color data applies or "length." This technique is referred to as a "run length" technique. Such a technique is described in detail in U.S. Pat. No. 4,847,677 entitled Video Telecommunication System And Method For Compressing And Decompressing Digital Color Video Data.

While the above-discussed compression technique represents a significant advance in the art, in some cases even greater data compression is desired. Such increased data compression should be lossless; that is, the system has the ability to recover the original data completely with no loss of original data.

A well known statistical data compression technique is that referred to as Huffman coding. Basically, the purpose of the Huffman coding technique is to reduce the average code length required to represent a data word. This is done by assigning the shortest code word to the most frequently occurring data word, longer code words to less frequently occurring data words and so on until the longest code word is assigned to the least frequently occurring data word. The Huffman codes are designed to be self-delimiting so that no shorter code word is duplicated as the beginning of the longer code word. Thus, no data word can be mistaken for another data word. This removes the need for delimiters such as spaces or additional delimiter code. In the case where there is an unequal distribution of data words, the overall effect of Huffman coding is that the number of bits required to represent the data is decreased and data compression results. While this technique has proved useful and has a number of applications, further compression than that available using this approach is desirable in some cases.

Those concerned with the transmission and storage of data have recognized the need for a data compression technique which provides even greater data compression yet has the ability to produce the original data without loss during decompression. The present invention fulfills those needs.

SUMMARY OF THE INVENTION

In accordance with the invention, a method and apparatus are provided for compressing and decompressing data. In the method and apparatus in accordance with the invention, a relational approach is used. During compression, a relationship between a next data word and a previous data word is determined and that relationship is encoded into a variable bit-length code word, the bit-length being inversely proportional to the probability of occurrence of the relationship between the data words. That is, a shorter bit-length code word is used for more frequently occurring relationships while a longer bit length code word is used for less frequently occurring relationships. The encoded relationships are transmitted rather than the data words themselves. A seed data word is provided to start the processing, and from that point, relationships between following words are encoded and transmitted. Thus, for the case where there is an unequal distribution of relationships, relationships having a higher frequency of occurrence will be represented by a substantially shortened bit-length code word with the overall effect of less data being transmitted or stored. The technique in accordance with the invention is lossless, that is, by means of decompressing the data in accordance with the invention, the original data can be recovered in its entirety.

A look-up table of code words is stored and is indexed according to the possible relationships. A relationship is determined between the previous and next data words and the relationship is matched to the index to find the corresponding code word in the look-up table. The corresponding code word is retrieved from the look-up table, is substituted for the relationship, and is transmitted.

Depending on the data being processed, the index words may be the relationships themselves. For example, in one embodiment, the relationship taken comprises subtracting the previous data word from the next data word and the difference is the index word in the look-up table. The code word corresponding to that difference is substituted for the relationship and transmitted.

In another embodiment, the relationship is the sequence of the words and their values. The look-up table is indexed by two indices, a first index is based on the possible values of the previous data word and the second index is based on the possible values of the next data word. The code words are selected in this table to correspond to the frequency of occurrence of the particular value of the next data word following the particular value of the previous data word. In this embodiment, the value of the previous data word is determined and matched to the first index of the look-up table. Then the value of the next data word is determined and matched to the second index of the look-up table. The indices are hierarchial in this embodiment with the first index being entered first, and from there, the second index may be entered. The code word corresponding to this double index is retrieved and substituted for the relationship and transmitted.

In the case of a color video run length word, a typical data word includes two segments, a length segment and a color segment. The length segment may be four bits and the color segment may be twelve bits in one embodiment. Data compression in accordance with the invention may occur in two parts in such a case. Two look-up tables are stored, one for the length data and one for the color data. The segments of the run length data are separated and may be processed in parallel. In regard to processing the relatively long color data segments, the color data segment of the previously occurring data word is subtracted from the color segment of the next occurring data word to result in a difference color word. The difference color word is used to enter the color data look-up table to locate a corresponding coded color word.

In regard to processing the relatively short length data segment, the length segment of the previously occurring data word is used to enter the length look-up table through a first index and the length data segment of the next occurring data word is used to proceed from the first index to a second index in the look-up table to locate the length code word. The located length code word is then retrieved. The coded color word is also retrieved as described above and is concatenated with the coded length word and the resulting concatenated code word is substituted for the relationship and is transmitted.

During decompression, the coded segments are separated, may be decompressed in parallel and are then combined into a color video run length word identical to the input word.

These and other objects and advantages of the invention will become apparent from the following more detailed description, when taken in conjunction with the accompanying drawings of illustrative embodiments.

DETAILED DESCRIPTION OF THE PREFERRED EMBODIMENT

In the following description, like reference numerals will be used to refer to like or corresponding elements in the different figures of the drawings. In accordance with the invention, a method and apparatus are provided for processing data by determining a relationship between data, compressing that relationship through a statistical encoding technique, transmitting the encoded relationship, decompressing the relationship and recovering the original data. In decompressing the data in accordance with the invention, the compressed relationship is decompressed and applied to a stored previous data word to result in the decompressed data.

Figure 1:
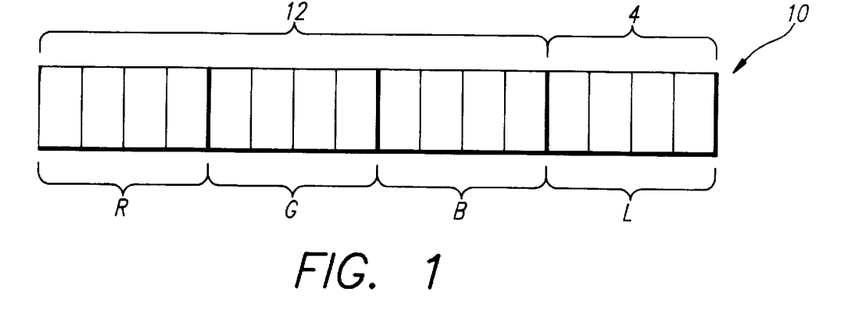
FIG. 1 presents a data word comprising sixteen bits, twelve of which pertain to color and the remaining four of which pertain to length.

Referring now to the drawings, and particularly to FIG. 1, there is shown a color video "run length" data word 10 comprising sixteen bits, twelve of which comprise a color segment 12 and are used for representing the color components and four of which comprise the length segment 14 and are used as a length component. Although a color video application is described, it should be noted that the invention is not so limited and may be used in other applications.

Figure 2A:
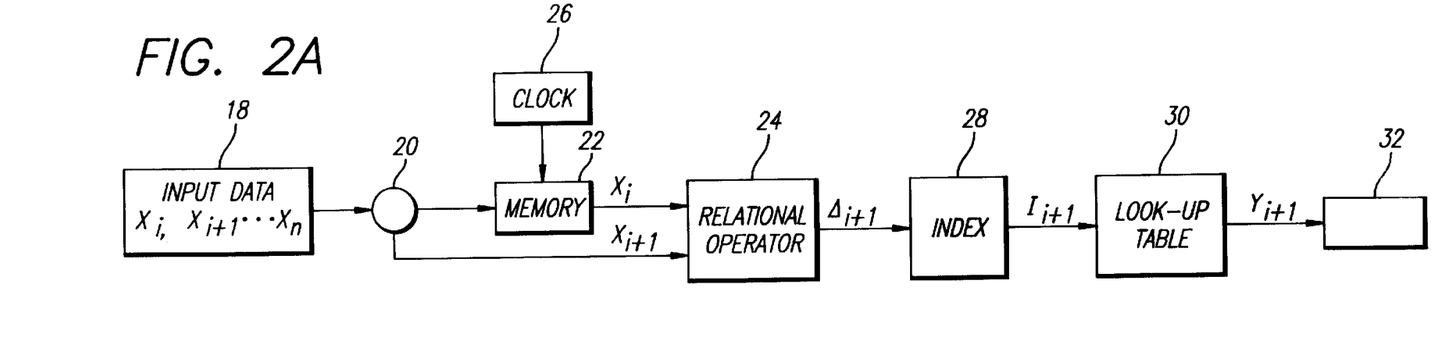
FIGS. 2A–B present a data processor using data compression in accordance with the principles of the invention showing a mode of continuous operation.
Figure 2B:
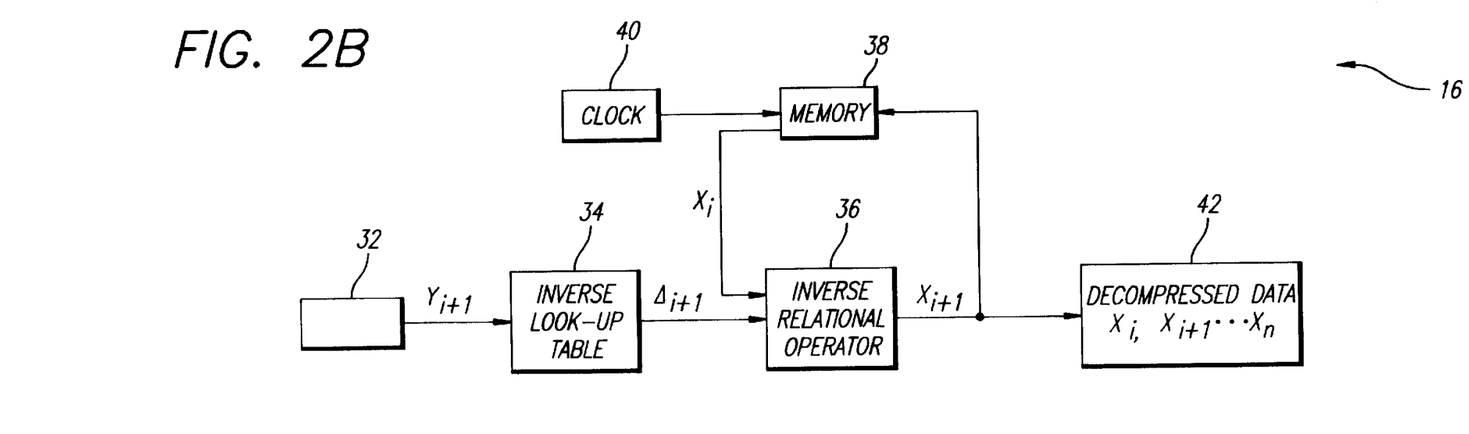
Figure 3A:
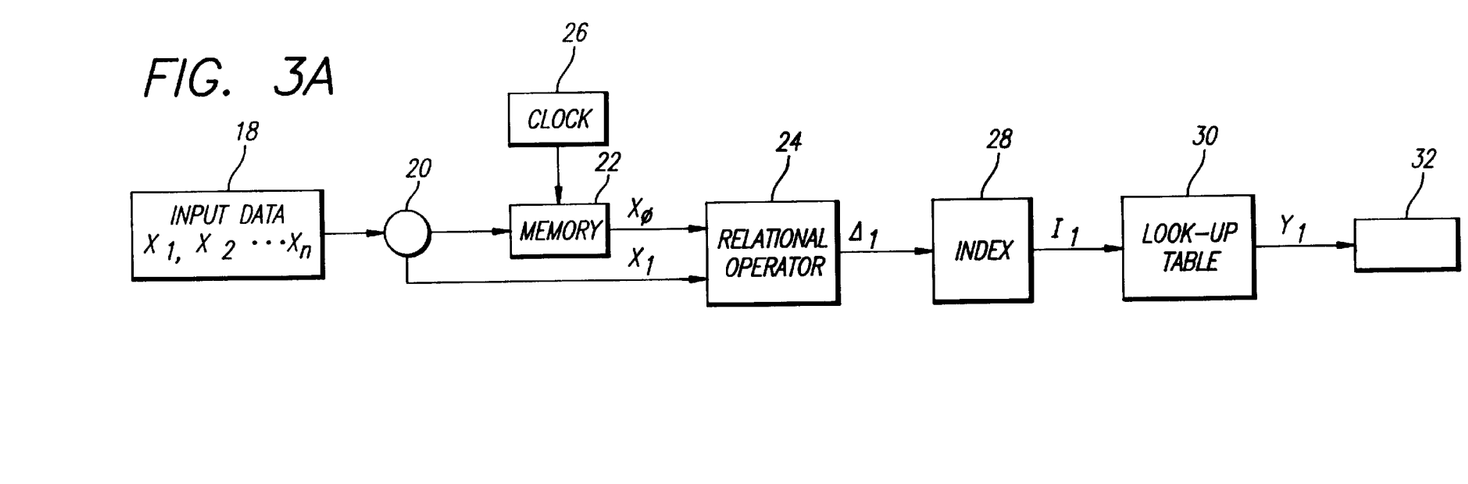
FIGS. 3A–B present the data processor of FIG. 2 in a start mode of operation.
Figure 3B:
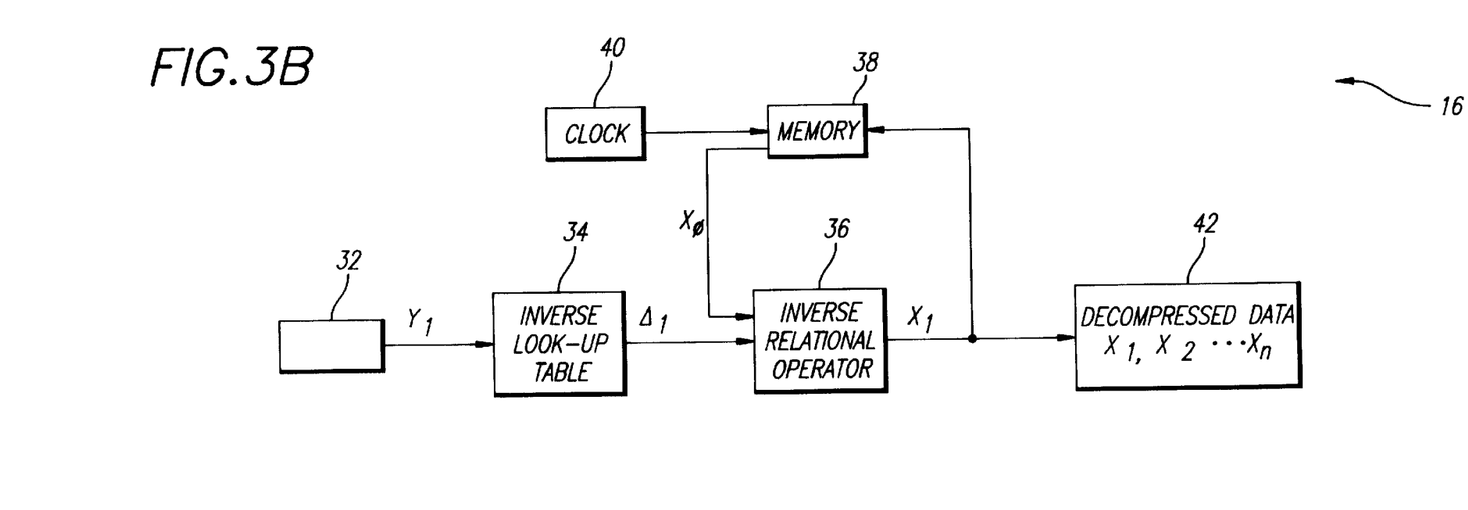
Figure 4A:
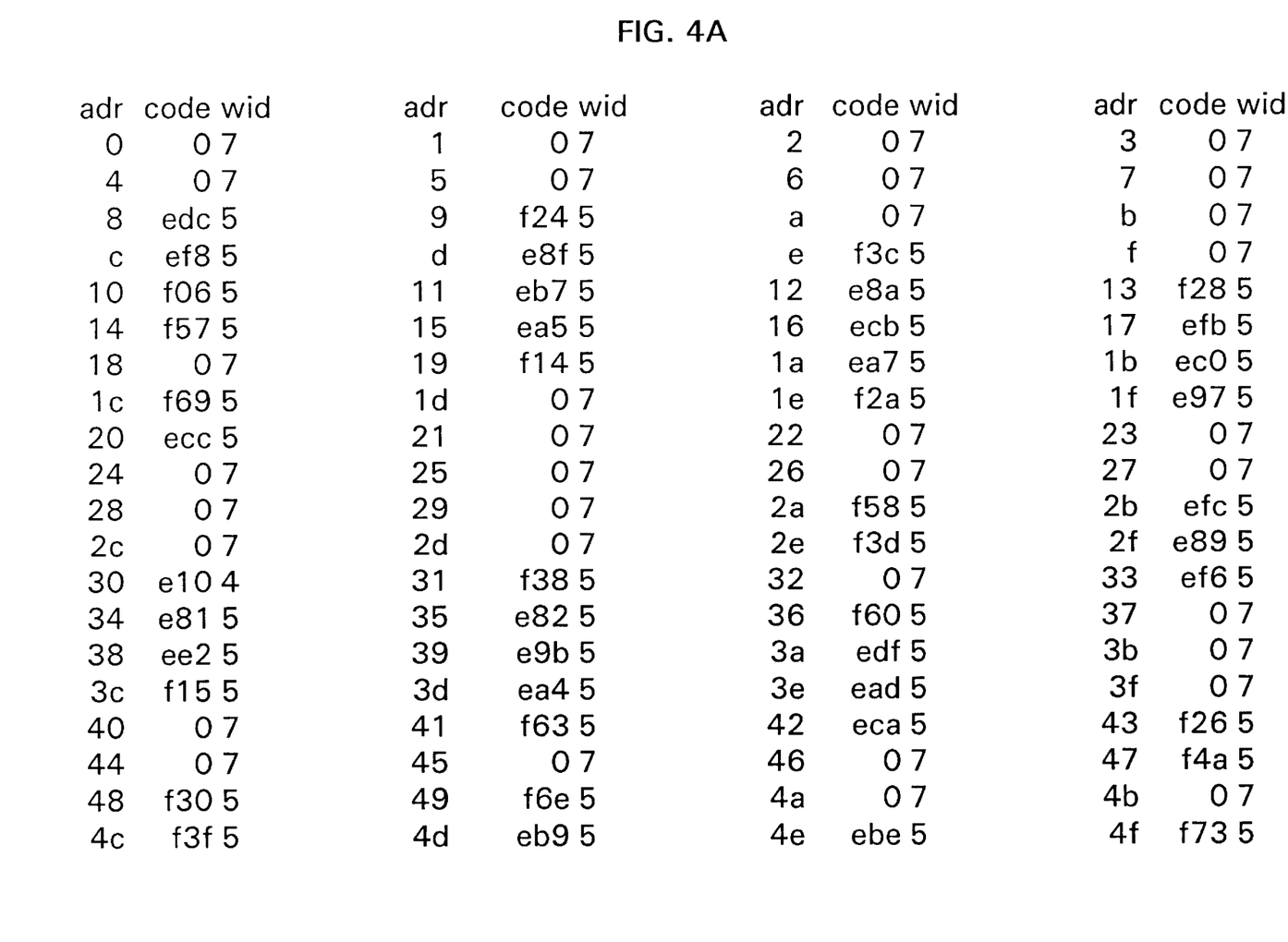
FIGS. 4A–G are a look-up table with associated index for a difference relationship.
Figure 4B:
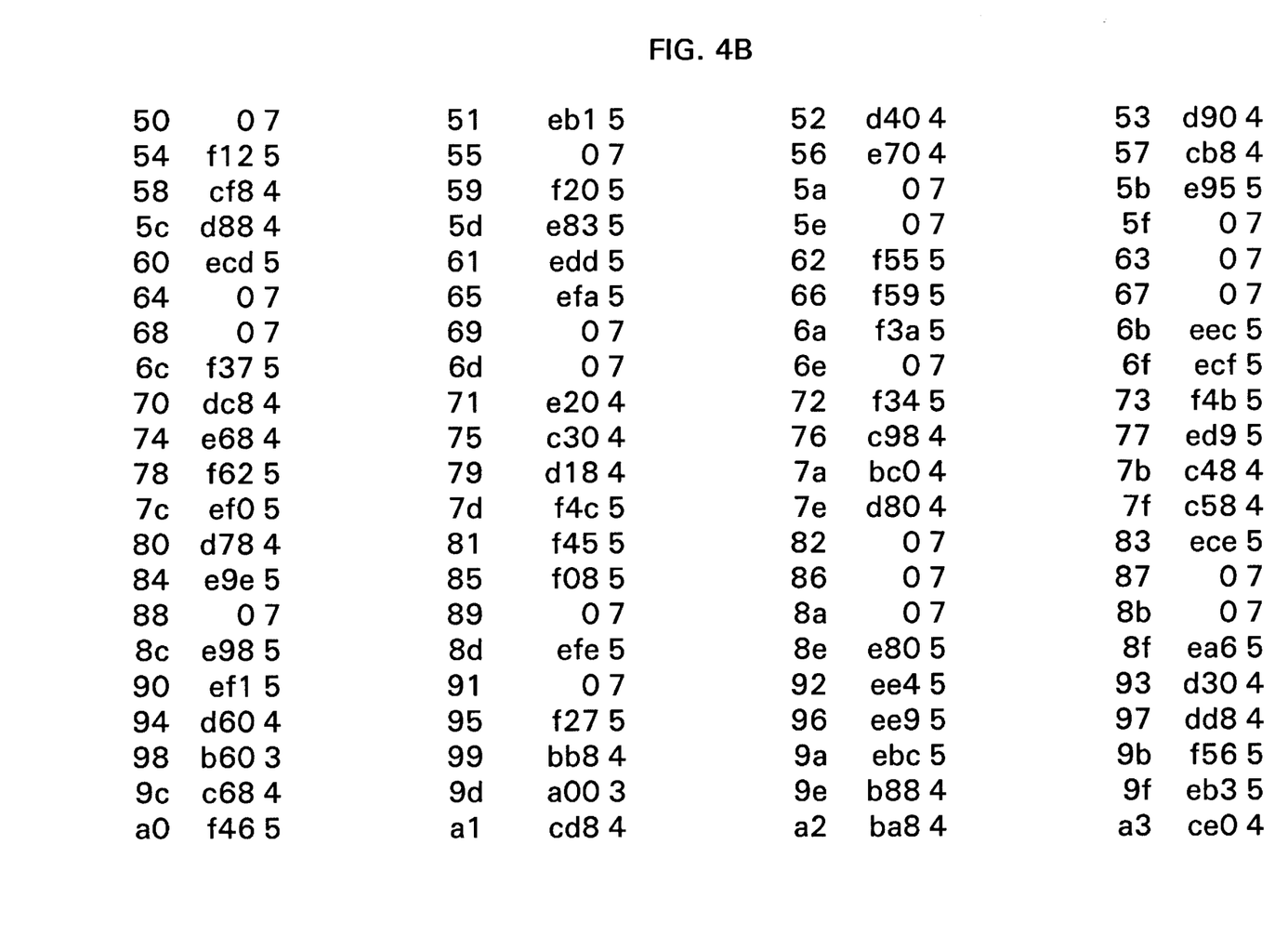
Figure 4C:
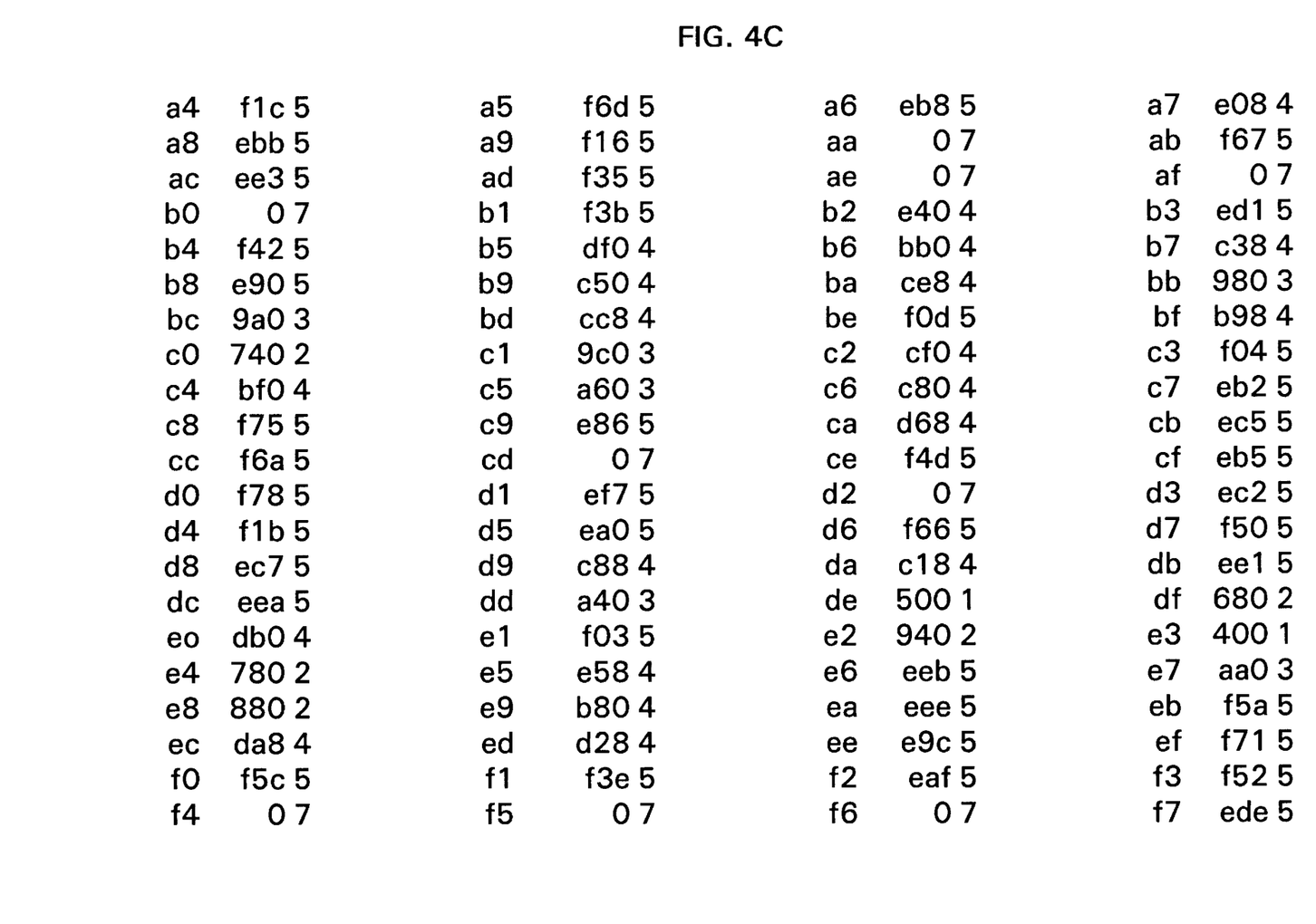
Figure 4D:
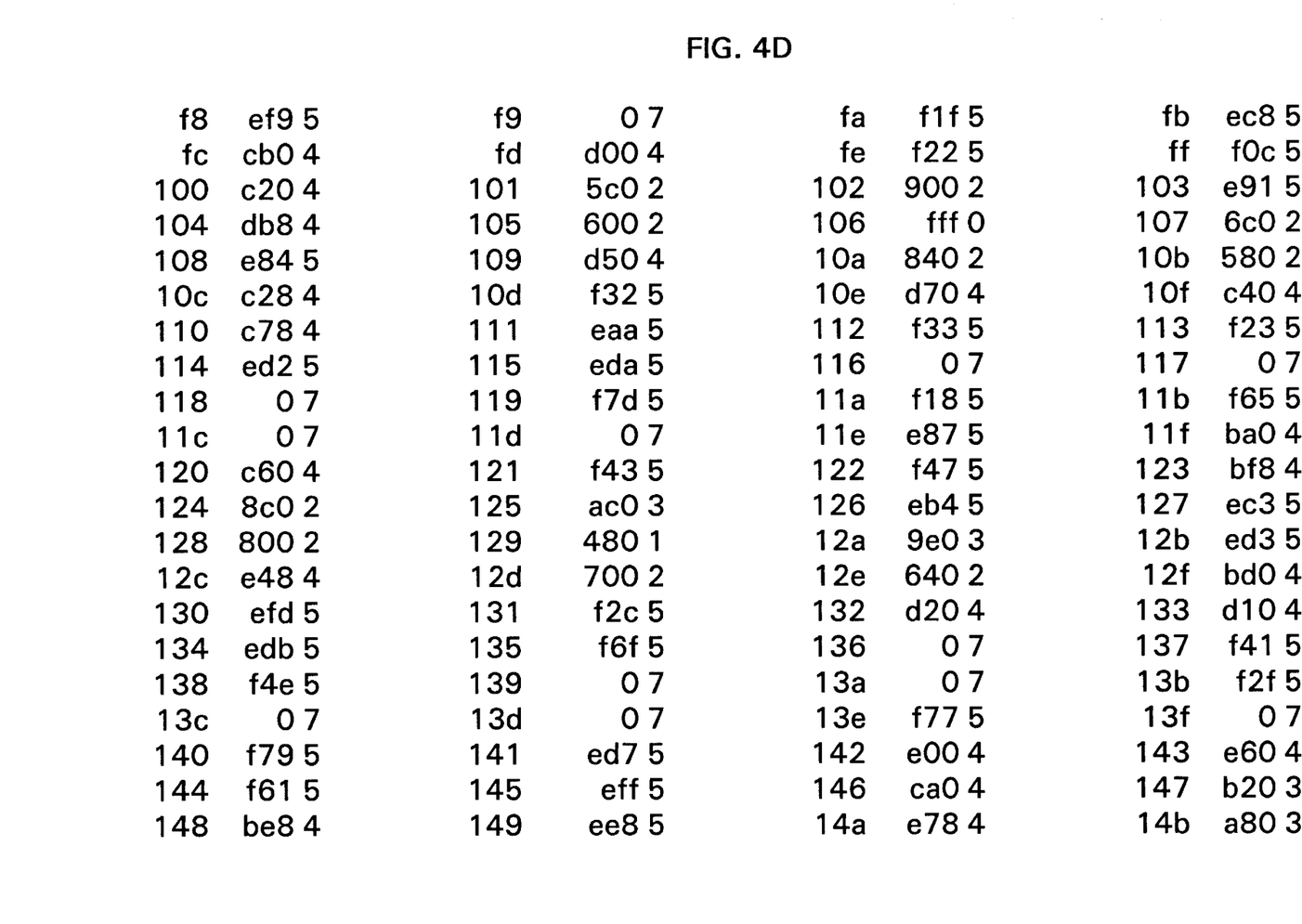
Figure 4E:
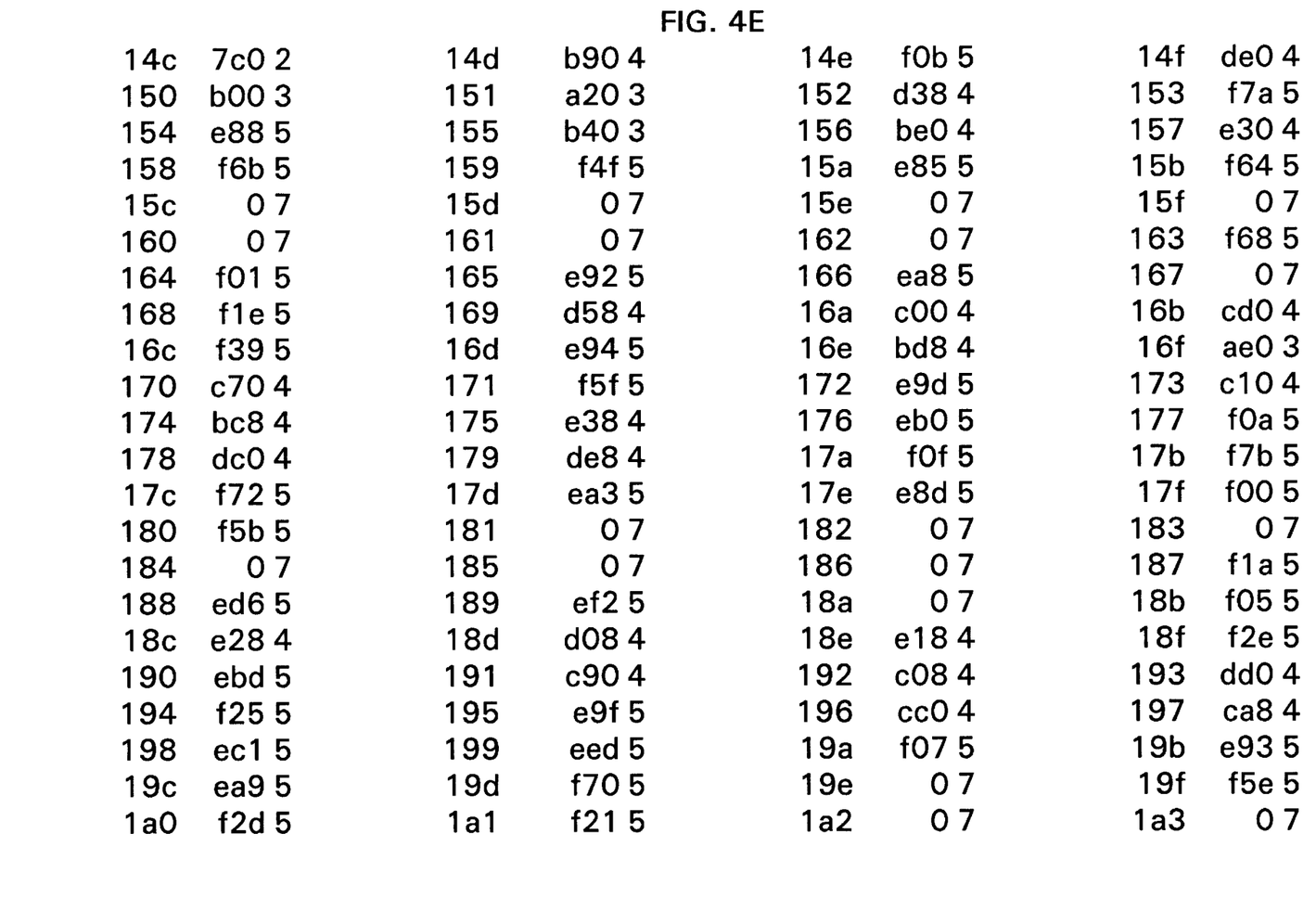
Figure 4F:
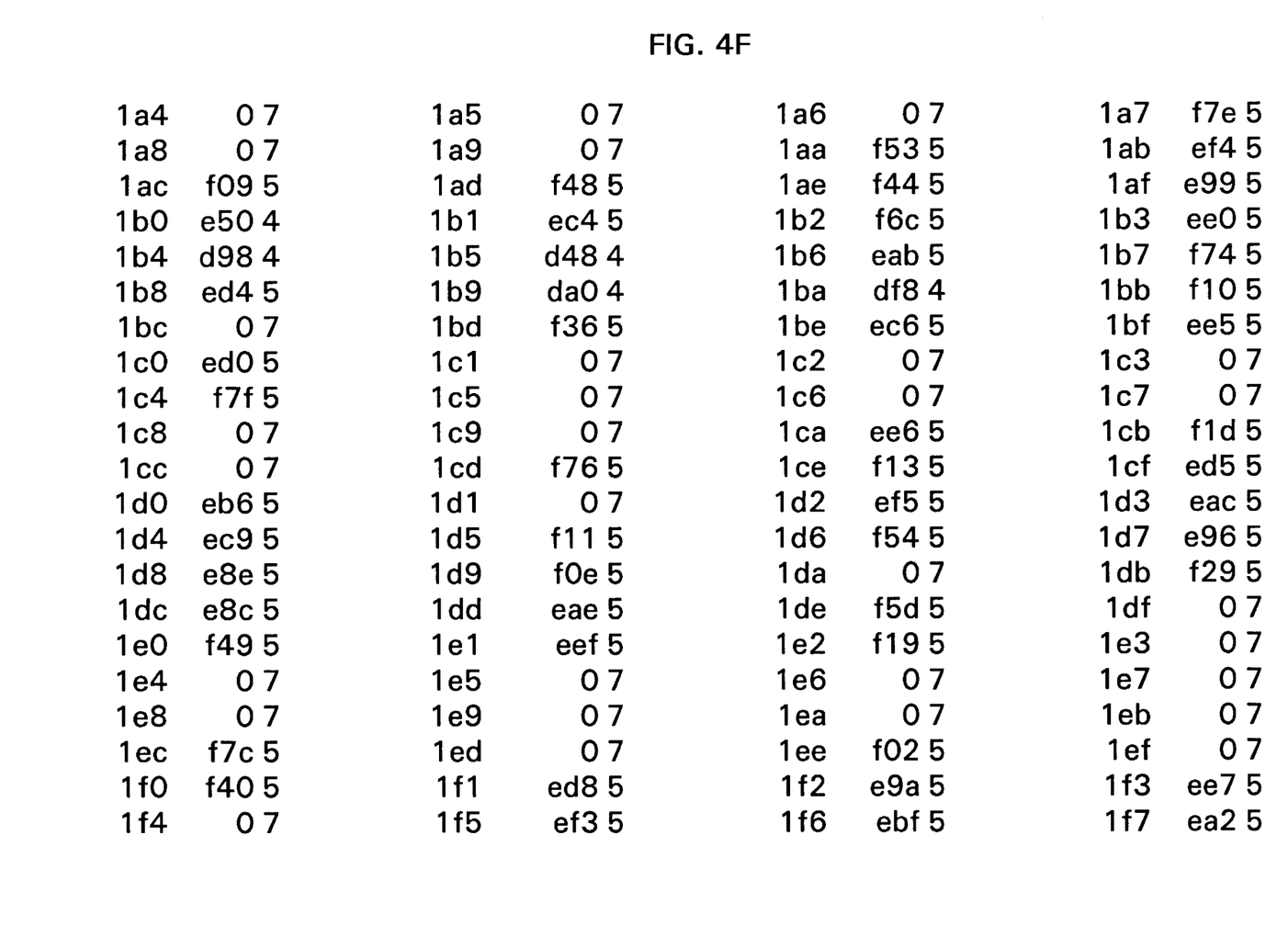
Figure 4G:
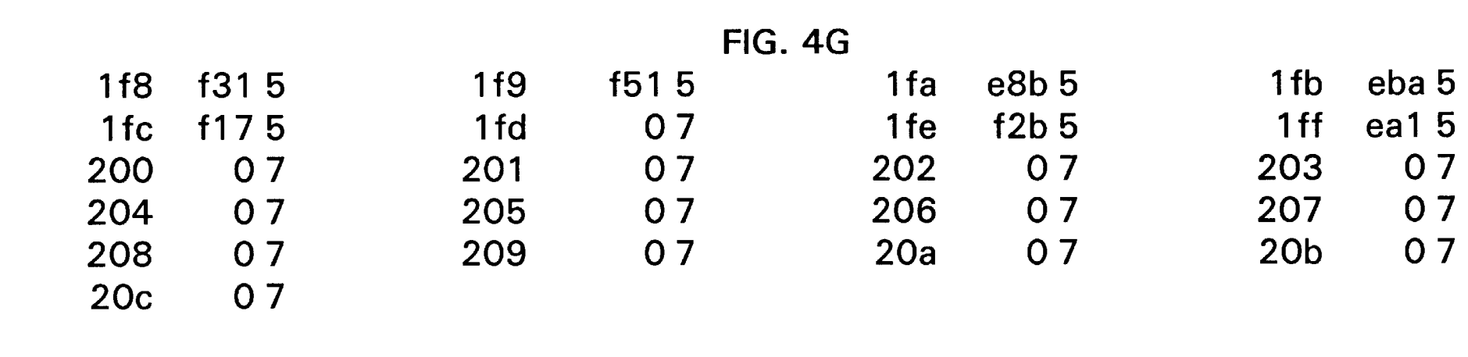

Referring now to FIGS. 2A–B, a data processing apparatus 16 is presented. FIGS. 2A–B present the processor 16 in a continuing operation mode. FIGS. 3A–B present the processor 16 in a start mode and is discussed below. Input data 18 is provided by means such as an image capture engine of U.S. Pat. No. 4,847,677 and may take the form of the data word presented in FIG. 1. Although an encoded data word is shown in FIG. 1, the invention is not limited to such words. Input data words may take other forms, such as raw data. Input data words taking the form of encoded data may have configurations other than that shown in FIG. 1. For example, Huffman encoded data may be processed. Additionally, the term "word" is not meant to be used herein in a restrictive sense but is used merely to describe a specific item of data which includes a plurality of bits and may or may not be equal to the quantity of bits of another data "word."

The input data words 18 indicated by $X_i$, $X_{i+1}$ through $X_n$ are provided and are split into two copies by splitter 20. In the case shown in FIG. 2A, $X_{i+1}$ is being provided as the input data word, the word $X_i$ having been provided previously. The splitter 20 sends a copy of $X_{i+1}$ both to a memory 22 and to the relational operator 24. The memory is clocked by clock 26 and upon receiving $X_{i+1}$, stores it and outputs the previously stored data word $X_i$. The relational operator 24 receives both $X_i$ and $X_{+i1}$ and determines a relationship between them which is signified by the output symbol $\Delta_{i+1}$. The particular relationship selected may take a plurality of forms depending upon the data being processed. For example, the relationship may be the difference between the two input data words or may be the particular sequence of the data words as will be described below in more detail.

The relationship $\Delta_{i+1}$ is received by an indexer 28 which then outputs a corresponding index word $I_{i+1}$. The index word is received by a look-up table 30 which then outputs a code word $Y_{i+1}$ responsive to the index word and which represents the coded relationship between $X_i$ and $X_{i+1}$. The code word $Y_{i+1}$ is transmitted over a medium 32, for example over telephone lines to a receiving apparatus, or transmitted to a storage device such as a fixed disk. Upon receipt, or retrieval if stored on a disk, the code word $Y_{i+1}$ is applied to an inverse look-up table 34 which outputs the actual relationship signified by the symbol $\Delta_{i+1}$. The relationship $\Delta_{i+1}$ is applied to an inverse relational operator 36 along with the previous data word $X_i$ which was stored in a memory 38 and is clocked out of the memory 38 by clock 40. The inverse relational operator 36 applies the relationship $\Delta_{i+1}$ to the previous data word $X_i$ to result in the decompressed, next data word $X_{i+1}$. This decompressed next data word is then output as decompressed data 42 and is also stored in memory 38 for operation with the following relationship.

The above operation uses the relationship between input data words to achieve data compression. The relationship is compressed and transmitted, not the data word itself. When first starting the processor, there is no previous data word to use with the next data word. In accordance with one embodiment of the invention, a seed data word is provided. Referring now to FIG. 3A, input data word $X_1$ will be provided 18 to the splitter 20. This data word will be clocked into the memory 22 just as in FIG. 2A; however, the memory 22 in this case will output a seed data word $X_0$ which will operate as the previous data word. This seed data word $X_0$ is also stored in the memory 38 in the decompressing portion of the processor 16 and is applied to the inverse relational operator 36 as described for FIG. 2A.

In the preferred embodiment, the code words stored in the look-up table 30 are variable length words and are statistically selected such that relationships occurring at a higher frequency are assigned the shorter length code words while relationships occurring with a lower frequency are assigned longer length code words. The index words 28 are assigned accordingly.

In the embodiment shown in FIG. 1 where the input data words comprise a twelve-bit segment of color data and a four-bit segment of length data, these two segments may be processed separately and their indexing and look-up tables may differ. For example, the twelve-bit segments of color data themselves may be used as input words. The relational operator 24 takes a difference relationship between the color data segment of the next data word and the color data segment of the previous data word. That is, the previous color data segment is subtracted from the next color data segment and the difference is taken as the relationship (represented as Δ in FIGS. 2A–B and 3A–B).

Because the color segments are twelve bits, a look-up table containing all possible differences between two such segments may have 4096 separate difference entries. These difference entries may be the index words themselves and the look-up table contains a code word corresponding to each possible index word. As discussed above, the code words are selected on a probability bases with the shorter code words being assigned to the differences having a higher probability of occurrence. For example, in one embodiment, it was found that the most frequently occurring difference between two input color segments was zero. A code word of "00" was assigned to this difference. In many other cases, the difference occurs so seldomly that the difference itself is used as the code word with an added header of five bits, each of value "one" for a total of seventeen bits. The added header indicates to the inverse look-up table that the code word is not in code but is the value itself. Thus, the variable length string will range from two to seventeen bits in length in this embodiment.

It is possible to lessen the size of the look-up table from 4096 entries to a smaller number when the statistical analysis results in sparse entries in the table. Such a shrinking of the table was accomplished in one embodiment through the use of an encoder technique. The resulting table is shown in FIGS. 4A–G where the "adr" column is the index in hex format, the "code" column is the code word and the "wid" column is the number of bits in the resulting code word in accordance with the table below:

| code width "wid" | no. of bits to be coded |
|---|---|
| 0 | 2 |
| 1 | 5 |
| 2 | 6 |
| 3 | 7 |
| 4 | 9 |
| 5 | 12 |
| 6 | not used |
| 7 | 17 |

A processing technique for determining the index word ("adr") in FIGS. 4A–G is given in the appendix hereto. The appendix is in the C programming language. The terms "dta_r, dta_g, and dta_b" represent red, green, and blue differences respectively. The term "out_codes" refers to the output code word "xyz". The variable "xyz" represents a twelve-bit difference. In case of the code word being equal to seven, which represents a seventeen-bit code to be sent, a five-bit header of all "ones" is concatenated with the twelve-bit difference.

Figure 5:
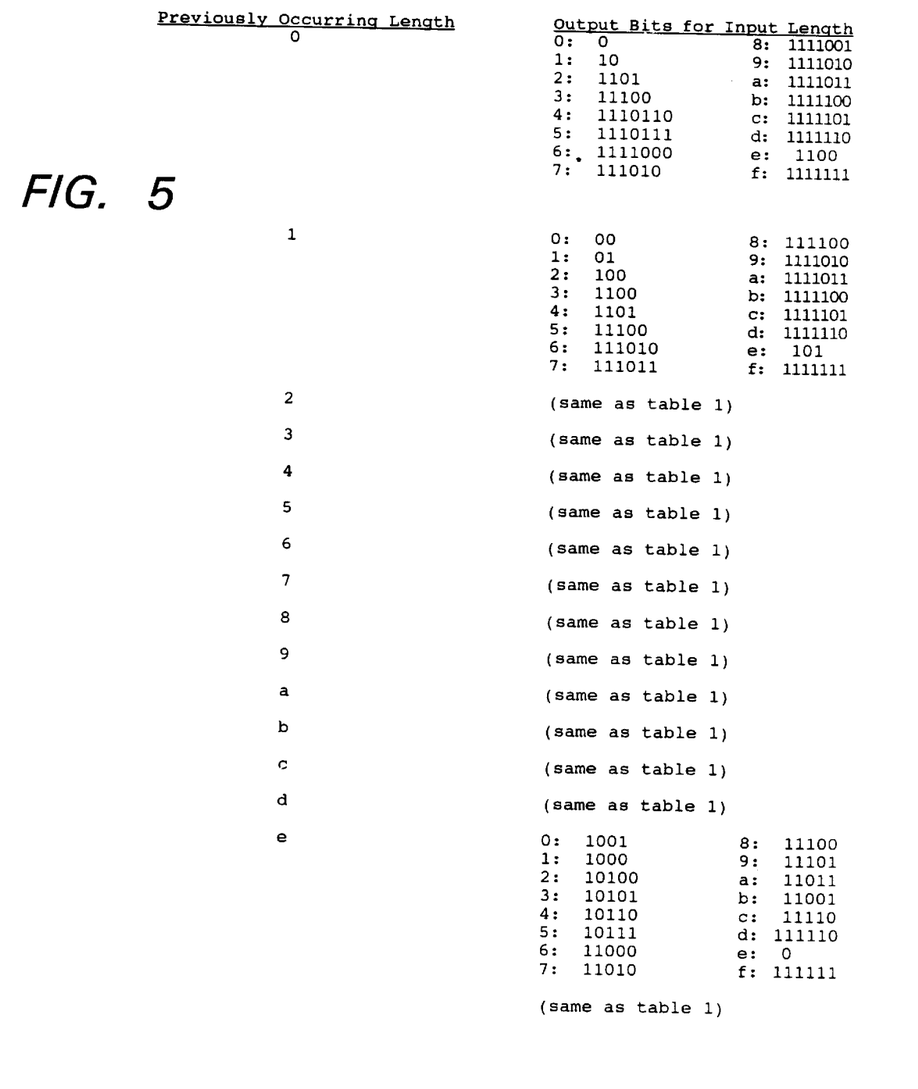
FIG. 5 is a look-up table with associated two hierarchical indices for a sequential relationship.

Referring again to FIG. 1, the four-bit segment of length data may be used as the input data word itself. A relationship between the length segment of the next data word and the length segment of the previous data word is taken and a code word assigned from a look-up table. In one embodiment, the relationship of a sequence of values was used. That is, the look-up table had two indices, the first corresponding to all possible values of the length segment of the previous data word and the second index corresponding to all possible values of the length segment of the next data word. These sequences of values are taken as the relationship (indicated as Δ in FIGS. 2A–B and 3A–B) in this embodiment. Because the length segments are four bits, and there are two indices, a look-up table containing all possible combinations would contain sixteen tables each having sixteen different code words. Such a look-up table is shown in FIG. 5 in hex and binary formats. As with the look-up table for the color segments, a statistical analysis was performed in determining the code words for the sequences. The most frequently occurring sequences received the shortest code words while the less frequently occurring sequences received the longer code words. For example, it was found that a frequently occurring sequence is a previous data word having a length segment of "e" followed by a next data word having a length segment of "e". The code word assigned is a single "0".

Figure 6A:
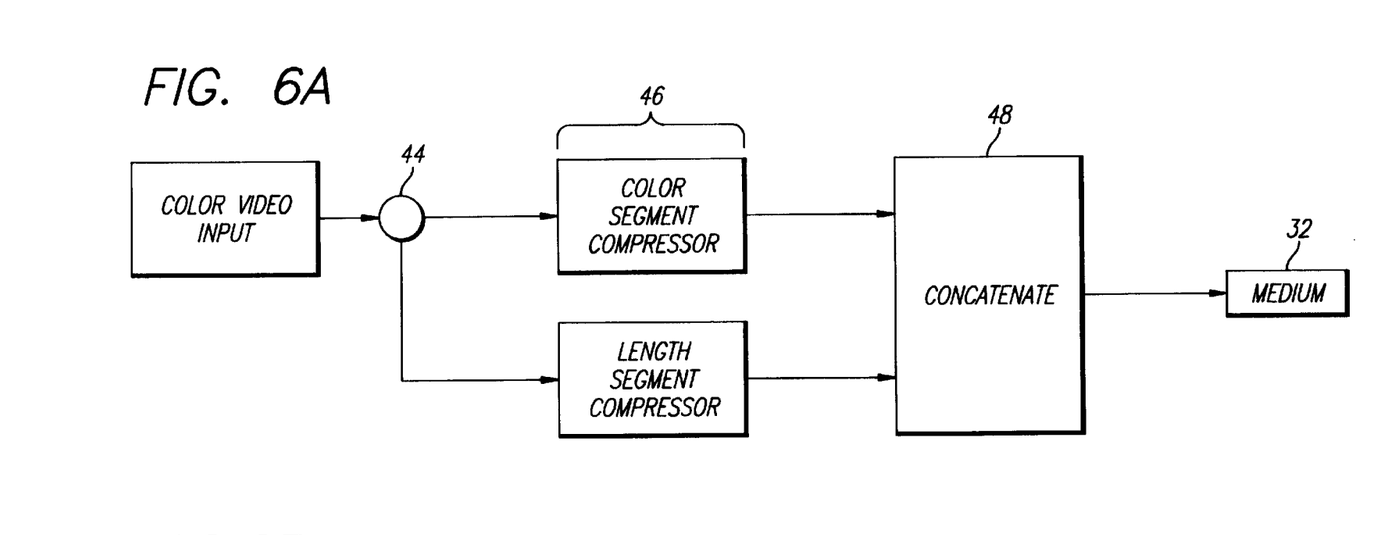
FIGS. 6A–B are a diagram of a processor in accordance with the invention wherein the input data word comprises two segments which are split apart for separate but parallel processing.
Figure 6B:
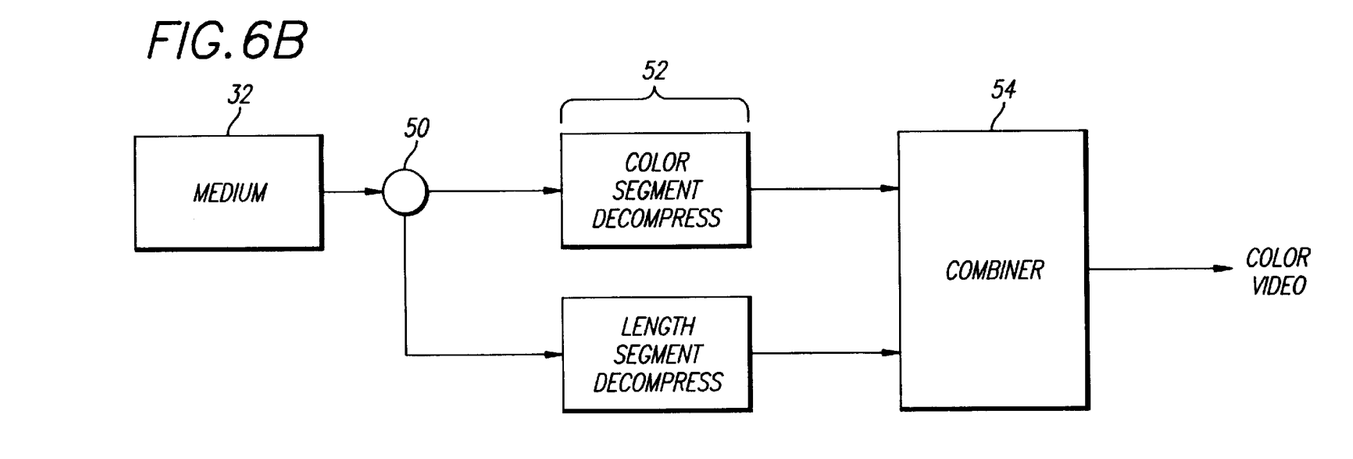

Referring now to FIGS. 6A–B, in the case of color video run length data, the data processing in accordance with the invention may occur in two parts. The color video input data word is separated into the color data segment and the length segment by a separator 44. Both segments are processed 46 as described above and the relationships compressed, and these compressions may occur in parallel as shown. The compressed relationships may be concatenated 48 and transmitted or stored through the medium 32. The compressed relationships may be received from the medium 32 and the color relationship sefparated 50 from the length relationship. Decompression 52 of each relationship occurs in parallel as described above and the decompressed segments are combined to result in the color video run length data word.

The technique in accordance with the invention is lossless, that is, by means of decompressing the data in accordance with the invention, the original data can be recovered in its entirety.

The invention is not meant to be limited to single pixels and the input data words may be a video frame of data or a scan line of data or other data. Additionally, the computed difference may be taken between the present color bits and the previously processed color (horizontal correlation) or from the nearest color (positionally) on the previously processed line.

In regard to the start mode of the processor shown in FIGS. 3A–B, the starter length segment of four bits is set to hex 0e (decimal 14) in one embodiment. The starter color segment of twelve bits is set to hex 088 in one embodiment.

Thus there has been provided a new and useful data compression method and apparatus for use in processing data including transmitting and storing data. The combination of the invention permits increased data compression than that provided by prior techniques. It will be apparent from the foregoing that, while particular forms of the invention have been illustrated and described, various modifications can be made without departing from the spirit and scope of the invention. Accordingly, it is not intended that the invention be limited, except as by the appended claims.

What is claimed is:

1. A method for processing data, the method comprising the steps of:
   receiving a previous data word having a plurality of bits:
   receiving a next data word having a plurality of bits:
   determining a relationship between the previous data word and the next data word;
   providing a relationship word representative of said determined relationship;
   encoding the relationship word into an encoded relationship word having fewer bits than either the previous data word or the next data word;
   storing the previous data word;
   decoding the encoded relationship word to result in the relationship word; and
   relating the decoded relationship word to the stored previous data word to provide the next data word.

2. A method for processing data, the method comprising the steps of:
   receiving a previous data word having a plurality of bits;
   receiving a next data word having a plurality of bits;
   determining a relationship between the previous data word and the next data word;
   providing a relationship word representative of said determined relationship; and
   encoding the relationship word into an encoded relationship word having fewer bits than either the previous data word or the next data word, the step of encoding comprising the steps of:
   storing a look-up table of variable length code words;
   indexing the code words with index words, the index words representing possible relationships between the next data word and the previous data word, and the index words being assigned to the code words such that the lengths of the code words are inversely proportional to the probability of occurrence of the index words;
   locating the index word in the look-up table corresponding to the relationship determined; and
   retrieving the code word from the look-up table which corresponds to the index word located and providing the code word as the encoded relationship signal.

3. The method of claim 2 wherein the step of determining a relationship comprises subtracting the previous data word from the next data word and taking the difference as the relationship word.

4. The method of claim 2 wherein:
   the step of indexing the code words comprises storing two sets of index words, the first set corresponds to the possible values of the previous data word and is used to index the second set of index words and the second set of index words corresponds to the possible values of the next data word; and
   the step of determining a relationship comprises matching the value of the previous data word to an index word in the first set of index words and then matching the value of the next data word to an index word in the second set of index words indexed by the matched first index word.

5. The method of claim 4 wherein the lengths of the code words are selected to be inversely proportional to the probability of occurrence of the sequences of values of the previous code word and the next code word.

6. The method of claim 2 wherein the previous and next data words each comprise a first segment and a second segment, each segment having a plurality of bits, and wherein:
   the step of storing a look-up table comprises storing first and second look-up tables;
   the step of indexing comprises the steps of:
      assigning index words for the first look-up table which are equal to the possible differences between the first segments of the previous and next data words when the first segment of the previous data word is subtracted from the first segment of the next data word;
      assigning index words for the second look-up table comprises storing two sets of index words, the first set corresponds to the possible values of the second segment of the previous data word and is used to index the second set of index words and the second set of index words corresponds to the possible values of the second segment of the next data word; and
   wherein the step of determining a relationship comprises subtracting the first segment of the previous data word from the first segment of the next data word to result in the index word for the first look-up table to identify the first code word corresponding thereto, and the step of determining further comprises matching the value of the second segment of the previous data word to a word in the first set of index words of the second look-up table and then matching the value of the second segment of the next data word to an index word in the second set of index words of the second look-up table to identify the second code word corresponding thereto;
   retrieving the first and second code words;
   further comprising the step of concatenating the first and second code words.

7. The method of claim 6 further comprising the steps of:
   storing the previous data word;
   receiving the concatenated code word;
   separating the first code word from the second code word;
   decoding the first code word to result in the first relationship word;
   decoding the second code word to result in the second relationship word; and
   relating the decoded first and second relationship words to the stored previous data word to provide the next data word.

8. An apparatus for processing data, the apparatus comprising:
   data means for providing previous and next data words, each data word having a plurality of bits;

a relational operator which receives the previous and next data words, determines the value of the previous data word, determines the value of the next data word and determines a relationship between said words based on the sequence of said values and outputs a relationship word representative of said determined relationship; and an encoder which encodes said relationship word and outputs an encoded word representative thereof, said encoded word having fewer bits than either the previous data word or the next data word.

9. An apparatus for processing data, the apparatus comprising:

data means for providing previous and next data words, each data word having a plurality of bits;

a relational operator which receives the first and second data words and determines a relationship between said words and outputs a relationship word representative of said determined relationship;

an encoder which encodes said relationship word and outputs an encoded word representative thereof said encoded word having fewer bits than either the previous data word or the next data word;

a memory which stores the previous data word;

a decoder adapted to decode the encoded relationship word to result in the relationship word; and an inverse relational operator adapted to relate the decoded relationship word to the stored previous data word to provide the next data word.

10. An apparatus for processing data, the apparatus comprising:

data means for providing previous and next data words, each data word having a plurality of bits;

a relational operator which receives the first and second data words and determines a relationship between said words and outputs a relationship word representative of said determined relationship; and an encoder which encodes said relationship word and outputs an encoded word representative thereof, said encoded word having fewer bits than either the previous data word or the next data word, wherein the encoder comprises:

a look-up table of variable length code words;

an indexer comprising index words corresponding to the code words, the index words representing possible relationships between the next data word and the previous data word, and the index words being assigned to the code words such that the lengths of the code words are inversely proportional to the probability of occurrence of the index words; and wherein said encoder is adapted to locate the index word in the look-up table which corresponds to the relationship determined and retrieves the code word from the look-up table which corresponds to the index word located and provides the code word as the encoded relationship word.

11. The apparatus of claim 10 wherein:

the relational operator subtracts the previous data word from the next data word and takes the difference as the relationship word.

12. The apparatus of claim 10 wherein:

the indexer comprises two sets of index words, the first set corresponds to the possible values of the previous data words and is used to index the second set of index words and the second set of index words corresponds to the possible values of the next data word; and the encoder matches the value of the previous data word to an index word in the first set of index words and then matches the value of the next data word to an index word in the second set of index words indexed by the matched first index word.

13. The apparatus of claim 12 wherein the lengths of the code words are selected to be inversely proportional to the probability of occurrence of the sequences of values of the previous code word and the next code word.

14. The apparatus of claim 10 wherein the previous and next data words each comprise a first segment and a second segment, each segment having a plurality of bits, and wherein:

the encoder comprises first and second look-up tables;

the indexer comprises:

index words for the first look-up table which are equal to the possible differences between the first segments of the previous and next data words when the first segment of the previous data word is subtracted from the first segment of the next data word;

index words for the second look-up table which comprise two sets of index words, the first set corresponds to the possible values of the second segment of the previous data word and is used to index the second set of index words and the second set of index words corresponds to the possible values of the second segment of the next data word; and the relational operator is adapted to subtract the first segment of the previous data word from the first segment of the next data word to result in the index word for the first look-up table to identify the first code word corresponding thereto, and is further adapted to match the value of the second segment of the previous data word to a word in the first set of index words of the second look-up table and then match the value of the second segment of the next data word to an index word in the second set of index words of the second look-up table to identify the second code word corresponding thereto;

wherein the encoder is also adapted to retrieve the first and second code words and concatenate the first and second code words.

15. The apparatus of claim 14 further comprising:

a second memory adapted to store the previous data word;

a separator adapted to separate the first code word from the second code word;

decoder means for decoding the first code word to result in the first relationship word and for decoding the second code word to result in the second relationship word; and an inverse relational operator adapted to relate the decoded first and second relationship words to the stored previous data word to provide the next data word.

* * * * *